US012279440B2

(12) United States Patent
Wang et al.

(10) Patent No.: US 12,279,440 B2
(45) Date of Patent: Apr. 15, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Xiaoguang Wang, Hefei (CN); Dinggui Zeng, Hefei (CN); Huihui Li, Hefei (CN); Jiefang Deng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 503 days.

(21) Appl. No.: 17/809,645

(22) Filed: Jun. 29, 2022

(65) Prior Publication Data

US 2023/0380191 A1    Nov. 23, 2023

Related U.S. Application Data

(63) Continuation of application No. PCT/CN2022/099199, filed on Jun. 16, 2022.

(30) Foreign Application Priority Data

May 18, 2022    (CN) .......................... 202210538172.9

(51) Int. Cl.
*H10B 63/00* (2023.01)
*H10B 53/30* (2023.01)
(Continued)

(52) U.S. Cl.
CPC ............. *H10B 63/80* (2023.02); *H10B 53/30* (2023.02); *H10B 61/22* (2023.02); *H10B 63/30* (2023.02); *H10N 50/01* (2023.02); *H10N 70/011* (2023.02)

(58) Field of Classification Search
CPC ........ H10B 63/80; H10B 61/22; H10B 53/30; H10B 63/30; H10N 50/01; H10N 70/011
(Continued)

(56) References Cited

U.S. PATENT DOCUMENTS 5,140,389 A * 8/1992 Kimura ................ H10B 12/318
257/E27.089
5,406,104 A * 4/1995 Hirota ................ H01L 29/0878
257/E29.12
(Continued)

FOREIGN PATENT DOCUMENTS

CN            1639796 A      7/2005
CN          101971336 A      2/2011
(Continued)

OTHER PUBLICATIONS

International Search Report cited in PCT/CN2022/099199 mailed Dec. 19, 2022, 9 pages.
(Continued)

*Primary Examiner* — Jami Valentine Miller
(74) *Attorney, Agent, or Firm* — Kilpatrick Townsend & Stockton LLP (57) ABSTRACT

The present disclosure relates to a semiconductor structure and a manufacturing method thereof, including: a substrate; a plurality of transistors, arranged based on a first preset pattern; a plurality of transistor contact structures, corresponding to the transistors, the bottom portions of the transistor contact structures are arranged based on the first preset pattern, and top portions of which are arranged based on the shape of a regular hexagon; a plurality of memory cells, corresponding to the transistor contact structures, the memory cells are arranged based on the shape of a regular hexagon; and a plurality of memory contact structures, corresponding to the memory cells, the bottom portions of the memory contact structures are arranged based on the shape of a regular hexagon, top portions of which are arranged based on a second preset pattern, and the second preset pattern is different from the first preset pattern.

20 Claims, 7 Drawing Sheets

(51) Int. Cl.
*H10B 61/00* (2023.01)
*H10N 50/01* (2023.01)
*H10N 70/00* (2023.01)

(58) Field of Classification Search
USPC .......................................................... 257/5
See application file for complete search history.

(56) References Cited

U.S. PATENT DOCUMENTS

| | | | |
|---|---|---|---|
| 6,567,300 | B1 | 5/2003 | Raberg et al. |
| 7,582,889 | B2 | 9/2009 | Asano |
| 7,746,680 | B2 | 6/2010 | Scheuerlein et al. |
| 9,425,057 | B2 | 8/2016 | Cho et al. |
| 9,899,399 | B2 | 2/2018 | Ogawa et al. |
| 10,049,711 | B2 | 8/2018 | Nakatsuka et al. |
| 10,985,209 | B2* | 4/2021 | Nakayama ............. H10N 50/80 |
| 2008/0303083 | A1* | 12/2008 | Oyu ...................... H01L 21/743 |
| | | | 257/329 |
| 2016/0379701 | A1* | 12/2016 | Nakatsuka ............. H10N 50/80 |
| | | | 365/51 |
| 2018/0277595 | A1 | 9/2018 | Miyakawa et al. |
| 2019/0157276 | A1* | 5/2019 | Ha ...................... H01L 21/0273 |
| 2020/0303453 | A1* | 9/2020 | Nakayama ............. H10N 50/85 |
| 2023/0094859 | A1* | 3/2023 | Wang ..................... H10B 63/30 |
| | | | 257/314 |

FOREIGN PATENT DOCUMENTS

| | | |
|---|---|---|
| CN | 103155139 A | 6/2013 |
| CN | 105448927 A | 3/2016 |
| CN | 106104790 A | 11/2016 |
| CN | 108040501 A | 5/2018 |
| CN | 111724829 A | 9/2020 |
| CN | 112582372 A | 3/2021 |
| JP | 2007149913 A | 6/2007 |

OTHER PUBLICATIONS

International Search Report cited in PCT/CN2022/078665 mailed May 20, 2022, 9 pages.

* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/099199, filed on Jun. 16, 2022, which claims the priority to Chinese Patent Application 202210538172.9, titled "SEMICONDUCTOR STRUCTURE AND MANUFACTURING METHOD THEREOF" and filed with China National Intellectual Property Administration (CNIPA) on May 18, 2022. The entire contents of International Patent Application No. PCT/CN2022/099199 and Chinese Patent Application 202210538172.9 are incorporated herein by reference.

TECHNICAL FIELD

The present disclosure relates to the technical field of integrated circuits, and in particular to a semiconductor structure and a manufacturing method thereof.

BACKGROUND

Non-volatile memories, with the characteristics of high read/write speed, low power consumption, anti-radiation, and long data retention time, are irreplaceable in the field with high reliability requirements, such as national defense and aerospace.

With the development of semiconductor technology, the non-volatile memory is required to have higher capacity. In order to increase the capacity of the non-volatile memory, it is necessary to arrange memory cells densely. However, the memory cells are located between the transistors and the bit line structures. While the arrangement of the memory cells is changed, it is necessary to adjust the positions of the transistors and the shapes of the bit line structures accordingly, which increases the production cost and process difficulty of the non-volatile memory. How to densely arrange the memory cells without changing the positions of the transistors or the shapes of the bit line structures becomes an urgent problem to be solved.

SUMMARY

A semiconductor structure and a manufacturing method thereof are provided according to various embodiments of the present disclosure.

A semiconductor structure, comprising:
a substrate, having a first surface;
a plurality of transistors, located on the first surface and arranged based on a first preset pattern;
a plurality of transistor contact structures, corresponding to the transistors in a one-to-one manner, where bottom portions of the transistor contact structures are in contact with the transistors respectively, the bottom portions of the transistor contact structures are arranged based on the first preset pattern, and top portions of the transistor contact structures are arranged based on the shape of a regular hexagon;
a plurality of memory cells, corresponding to the transistor contact structures in a one-to-one manner, where bottom portions of the memory cells are in contact with the top portions of the transistor contact structures respectively, and the memory cells are arranged based on the shape of a regular hexagon and located at vertex positions and a central position of the regular hexagon; and
a plurality of memory contact structures, corresponding to the memory cells in a one-to-one manner, where bottom portions of the memory contact structures are in contact with top portions of the memory cells respectively, the bottom portions of the memory contact structures are arranged based on the shape of a regular hexagon, top portions of the memory contact structures are arranged based on a second preset pattern, and the second preset pattern is different from the first preset pattern;
where the bottom portion of the transistor contact structure is arranged opposite to the top portion of the transistor contact structure, and the bottom portion of the memory contact structure is arranged opposite to the top portion of the memory contact structure.

The present disclosure further provides a manufacturing method of a semiconductor structure, including:
providing a substrate, where the substrate has a first surface;
forming a plurality of transistors on the first surface, where the transistors are arranged based on a first preset pattern;
forming transistor contact structures on the transistors respectively, where bottom portions of the transistor contact structures are in contact with the transistors respectively, the bottom portions of the transistor contact structures are arranged based on the first preset pattern, and top portions of the transistor contact structures are arranged based on the shape of a regular hexagon;
forming memory cells on the top portions of the transistor contact structures respectively, where the memory cells are arranged based on the shape of a regular hexagon and located at vertex positions and a central position of the regular hexagon; and
forming memory contact structures on top portions of the memory cells respectively, where bottom portions of the memory contact structures are arranged based on the shape of a regular hexagon, the top portions of the memory contact structures are arranged based on a second preset pattern, and the second preset pattern is different from the first preset pattern;
where the bottom portion of the transistor contact structure is arranged opposite to the top portion of the transistor contact structure, and the bottom portion of the memory contact structure is arranged opposite to the top portion of the memory contact structure.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present disclosure, and a person of ordinary skill in the art may still derive other accompanying drawings from these accompanying drawings without creative efforts.

DETAILED DESCRIPTION

To facilitate the understanding of the present disclosure, the present disclosure will be described more completely below with reference to the accompanying drawings. The embodiments of the present disclosure are shown in the drawings. However, the present disclosure may be embodied in various forms without being limited to the embodiments described herein. These embodiments are provided in order to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doped type or section from another element, component, region, layer, doped type or section. Therefore, without departing from the teachings of the present application, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over and described as being "beneath another element", "below it", or "under it", the device or feature is oriented "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In this specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

After the semiconductor technology entered the era of 22 nm, the flash memory technology based on floating gate storage charge has encountered difficulties in size reduction. The phase change random access memory (PCRAM) technology is now widely used due to its superiority over the flash memory technology in many aspects such as a cell area, a read/write speed, the number of read/write times, and a data retention time.

In order to improve the integration of memory cells in the PCRAM while ensuring the accuracy of data writing, dense arrangement of the memory cells in the PCRAM is crucial. However, the memory cells are located between the transistors and the bit line structures. While the arrangement of the memory cells is changed, it is necessary to adjust the positions of the transistors and the shapes of the bit line structures accordingly, which increases the production cost and process difficulty of the PCRAM.

Figure 1:
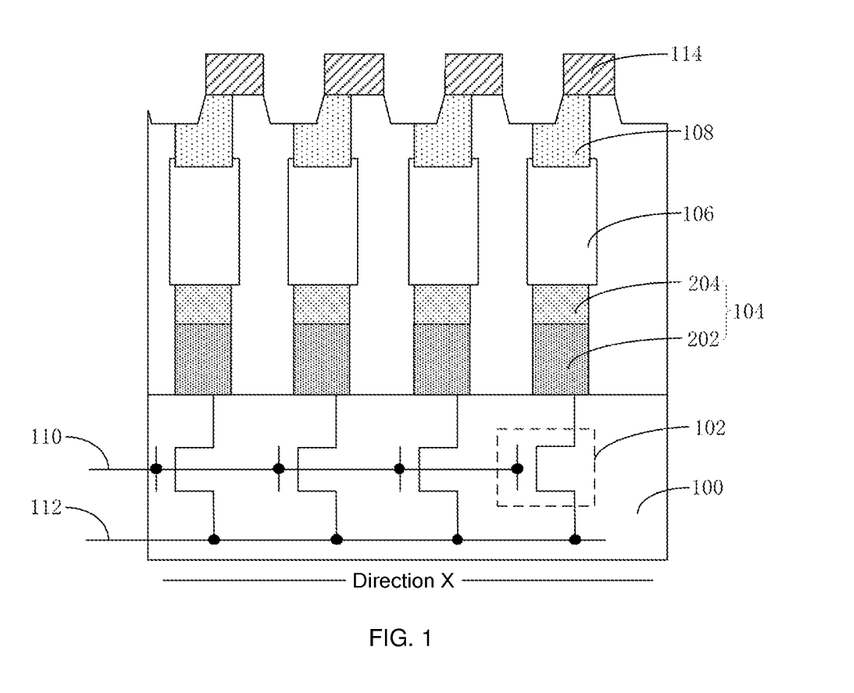
FIG. 1 is a schematic cross-sectional diagram of a semiconductor structure according to Embodiment 1.

FIG. 1 is a schematic cross-sectional diagram of a semiconductor structure according to Embodiment 1. Referring to FIG. 1, in this embodiment, a semiconductor structure is provided, including: a substrate 100, a plurality of transistors 102, a plurality of transistor contact structures 104, a plurality of memory cells 106, and a plurality of memory contact structures 108. The substrate 100 has a first surface. The transistors 102 are located on the first surface, and are arranged based on a first preset pattern. That is, the transistors 102 are arranged on the first surface of the substrate 100 based on the first preset pattern. The transistor contact structures 104 are located between the transistors 102 and the memory cells 106, and are in contact with the transistors 102 and the memory cells 106. That is, bottom portions of the transistor contact structure 104 are in contact with the transistors 102 respectively, and top portions of the transistor contact structures 104 are in contact with the memory cells 106 respectively. The transistor contact structures 104 correspond to the transistors 102 in a one-to-one manner. The bottom portions of the transistor contact structures 104 are arranged based on the first preset pattern, and the top portions of the transistor contact structures 104 are arranged based on the shape of a regular hexagon. The memory cells 106 correspond to the transistor contact structures 104 in a one-to-one manner. The memory cells 106 are arranged based on the shape of a regular hexagon and located at vertex positions and a central position of the regular hexagon. The memory contact structures 108 correspond to the memory cells 106 in a one-to-one manner. Bottom portions of the memory contact structures 108 are in contact with top portions of the memory cells 106 respectively. The bottom portions of the memory contact structures 108 are arranged based on the shape of a regular hexagon. Top portions of the memory contact structures 108 are arranged based on a second preset pattern, and the second preset pattern is different from the first preset pattern. The bottom portion of the transistor contact structure 104 is arranged opposite to the top portion of the transistor contact structure 104. The bottom portion of the memory contact structure 108 is arranged opposite to the top portion of the memory contact structure 108. That is, the bottom portion of the transistor contact structure 104 is parallel to the top portion of the transistor contact structure 104, and the bottom portion of the memory contact structure 108 is parallel to the top portion of the memory contact structure 108.

The semiconductor structure includes a plurality of transistors 102, located on a first surface, where the transistors 102 are arranged based on a first preset pattern; a plurality of transistor contact structures 104, corresponding to the transistors 102 in a one-to-one manner, where bottom portions of the transistor contact structures 104 are in contact with the transistors 102 respectively, the bottom portions of the transistor contact structures 104 are arranged based on the first preset pattern, and top portions of the transistor contact structures 104 are arranged based on the shape of a regular hexagon; a plurality of memory cells 106, corresponding to the transistor contact structures 104 in a one-to-one manner, where bottom portions of the memory cells 106 are in contact with the top portions of the transistor contact structures 104 respectively, and the memory cells 106 are arranged based on the shape of a regular hexagon and located at vertex positions and a central position of the regular hexagon; and a plurality of memory contact structures 108, corresponding to the memory cells 106 in a one-to-one manner, where bottom portions of the memory contact structures 108 are in contact with top portions of the memory cells 106 respectively, the bottom portions of the memory contact structures 108 are arranged based on the shape of a regular hexagon, and top portions of the memory contact structures 108 are arranged based on a second preset pattern, and the second preset pattern is different from the first preset pattern. The bottom portion of the transistor contact structure 104 is arranged opposite to the top portion of the transistor contact structure 104, and the bottom portion of the memory contact structure 108 is arranged opposite to the top portion of the memory contact structure 108. By disposing the transistor contact structures 104 of which the bottom portions are arranged based on the first preset pattern and the top portions are arranged based on the shape of a regular hexagon, and the memory contact structures 108 of which the bottom portions are arranged based on the shape of a regular hexagon and the top portions are arranged based on the second preset pattern, the transistors 102, the memory cells 106, and device structures above the memory cells 106 are manufactured without changing positions or shapes of the transistors 102 and the device structures above the memory cells 106, thereby reducing the process difficulty and production cost.

Figure 2:
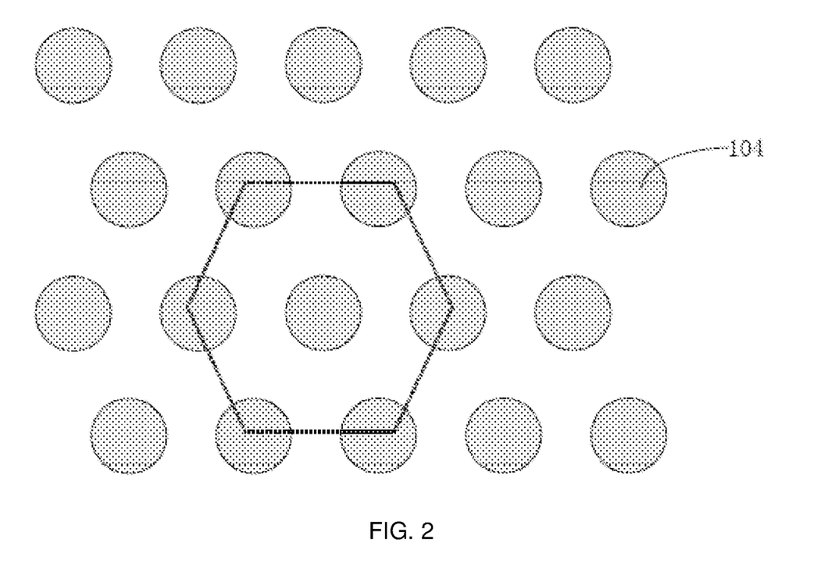
FIG. 2 is a schematic top view of transistor contact structures in a semiconductor structure after the transistor contact structures are formed according to an embodiment.

FIG. 2 is a schematic top view of transistor contact structures 104 in a semiconductor structure after the transistor contact structures 104 are formed according to an embodiment. As shown in FIG. 2, in an embodiment, the first preset pattern arranged includes a regular hexagon, and the transistors 102 are located at vertex positions and a central position of the regular hexagon. In this case, the transistor contact structure 104 is a columnar structure above the transistor 102; orthographic projections of the top portion of the transistor contact structure 104 and the bottom portion of the transistor contact structure 104 on the first surface coincide with each other.

In an embodiment, an area of the top portion of the transistor contact structure 104 is equal to that of the bottom portion of the transistor contact structure 104.

Figure 3:
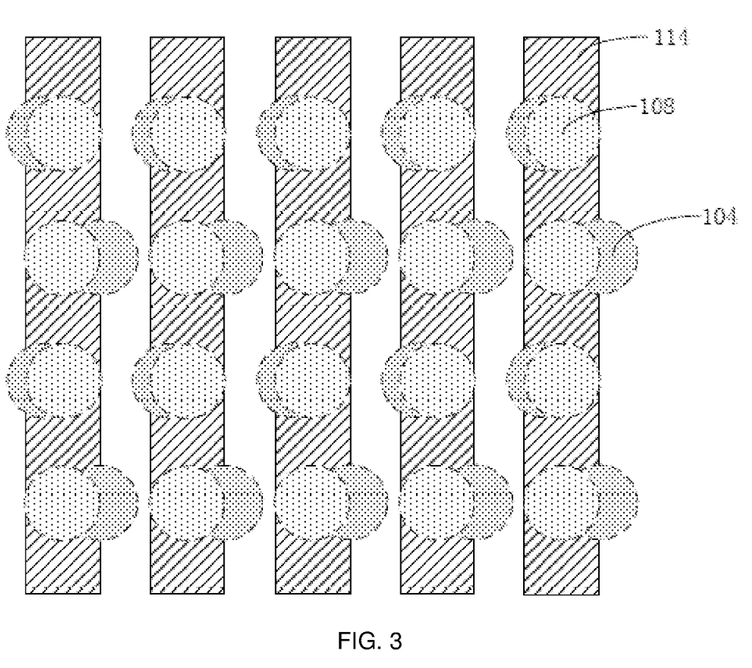
FIG. 3 is a schematic top view of a semiconductor structure according to an embodiment.

FIG. 3 is a schematic top view of a semiconductor structure according to an embodiment. As shown in FIG. 3, in an embodiment, the second preset pattern includes an arrangement array with a plurality of rows and columns.

In an embodiment, an area of the bottom portion of the memory contact structure 108 is larger than that of the top portion of the memory contact structure 108.

In an embodiment, an area of the bottom portion of the memory contact structure 108 is larger than that of the top portion of the memory cell 106. In other embodiments, the area of the bottom portion of the memory contact structure 108 is smaller than or equal to the area of the top portion of the memory cell 106. Such a configuration allows the memory contact structure 108 to be in close contact with the memory cell 106 while avoiding damage to the memory cell 106 in the process of forming the memory contact structure 108.

In an embodiment, a material of the memory contact structure 108 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi).

Figure 4:
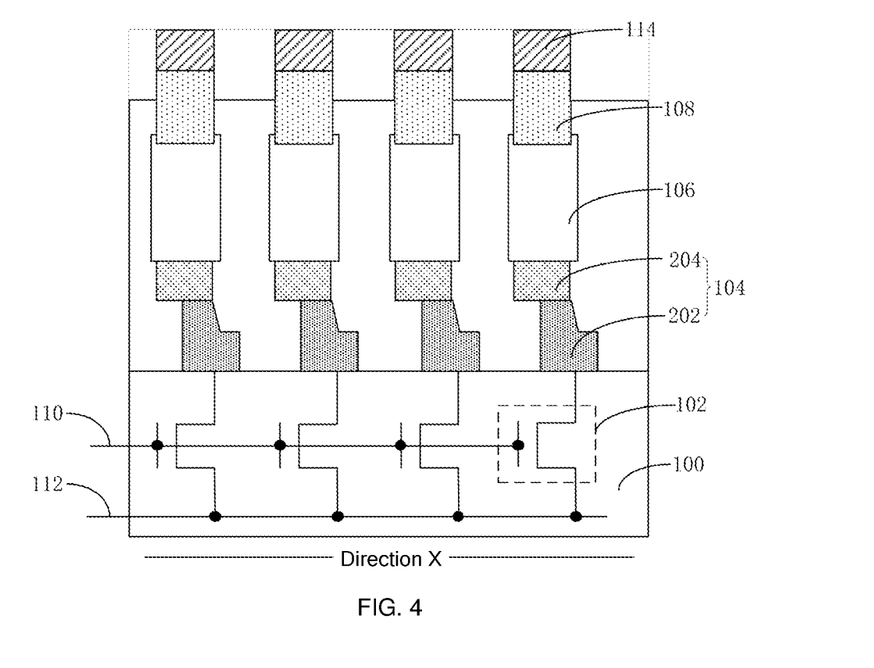
FIG. 4 is a schematic cross-sectional diagram of a semiconductor structure according to Embodiment 2.

FIG. 4 is a schematic cross-sectional diagram of a semiconductor structure according to Embodiment 2. As shown in FIG. 4, in an embodiment, the first preset pattern includes an array with a plurality of rows and columns.

In an embodiment, an area of the top portion of the transistor contact structure 104 is smaller than that of the bottom portion of the transistor contact structure 104.

Further referring to FIG. 4, in an embodiment, the second preset pattern includes a regular hexagon, and the memory contact structures 108 are located at vertex positions and a central position of the regular hexagon.

In an embodiment, an area of the top portion of the memory contact structure 108 is larger than that of the bottom portion of the memory contact structure 108.

Further referring to FIG. 1 and FIG. 4, in an embodiment, the transistor contact structures 104 each include: a first lead-out structure 202 and a second lead-out structure 204. A bottom portion of the first lead-out structure 202 is the bottom portion of the transistor contact structure 104, and the first lead-out structure 202 is used for leading out the transistor 102. For example, the bottom portion of the first lead-out structure 202 is connected to a drain region of the transistor 102 to lead out the drain region of the transistor 102. Typically, an area of the bottom portion of the first lead-out structure 202 is equal to that of the drain region of the transistor 102. A bottom portion of the second lead-out structure 204 is in contact with a top portion of the first lead-out structure 202, and a top portion of the second lead-out structure 204 is the top portion of the transistor contact structure 104. The bottom portion of the first lead-out structure 202 is arranged opposite to the top portion of the first lead-out structure 202, and the bottom portion of the second lead-out structure 204 is arranged opposite to the top portion of the second lead-out structure 204. In this case, the bottom portions of the first lead-out structures 202 are arranged based on the first preset pattern, and the top portions of the second lead-out structure 204 are arranged based on the shape of a regular hexagon.

In an embodiment, an area of the bottom portion of the second lead-out structure 204 is not smaller than that of the top portion of the first lead-out structure 202.

In an embodiment, a portion of the first lead-out structure 202 which is close to the bottom portion of the second lead-out structure 204 is a trapezoidal structure.

In an embodiment, materials of the first lead-out structure 202 and the second lead-out structure 204 include one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi). For example, the material of at least one of the memory contact structure 108, the first lead-out structure 202, and the second lead-out structure 204 is different from others. For example, the material of the first lead-out structure 202 is different from the material of the memory contact structure 108 and the second lead-out structure 204. In practical application, a same material may be selected as required to manufacture the memory contact structure 108, the first lead-out structure 202, and the second lead-out structure 204.

In an embodiment, the memory cell 106 includes a ferroelectric memory cell, a magnetoresistive memory cell, a resistance change memory cell, or a phase change memory cell.

Figure 5:
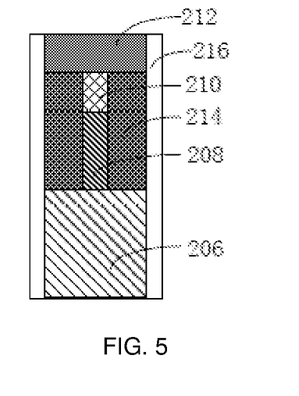
FIG. 5 is a schematic cross-sectional diagram of a memory cell according to an embodiment.

FIG. 5 is a schematic cross-sectional diagram of a memory cell 106 according to an embodiment. As shown in FIG. 5, in this embodiment, the memory cell 106 is a phase change memory cell, which includes a bottom electrode 206, a metal layer 208, a phase change material layer 210, and a top electrode 212. The bottom electrode 206 is in contact with an upper surface of the transistor contact structure 104. The metal layer 208 is located on an upper surface of the bottom electrode 206. The phase change material layer 210 is located on an upper surface of the metal layer 208, and performs reversible phase transitions between a crystalline state (low resistance state) and an amorphous state (high resistance state) depending on applied voltage or current pulse signals of different widths and heights, thereby implementing information write ("1") and erase ("0") operations. The top electrode is located on an upper surface of the phase change material layer 210. For example, a material of the phase change material layer 210 includes a sulfide material or a synthetic material containing germanium, antimony and tellurium (GST), such as $Ge_2Sb_2Te_5$.

In an embodiment, materials of the bottom electrode 206, the metal layer 208, and the top electrode 212 include one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi). For example, the material of at least one of the bottom electrode 206, the metal layer 208, and the top electrode 212 is different from others. For example, the material of the top electrode 212 is different from the material of the bottom electrode 206 and the metal layer 208. In practical application, a same material may be selected as required to manufacture the bottom electrode 206, the metal layer 208, and the top electrode 212.

The basic storage principle of the phase change memory cell (namely, phase change random access memory, PCRAM for short) is as follows: voltage or current pulse signals of different widths and heights are applied between the bottom electrode 206 and the top electrode 212 of the memory cell 106, to cause physical phase changes of the phase change material layer 210; that is, the phase change material layer 210 performs reversible phase transitions between a crystalline state (low resistance state) and an amorphous state (high resistance state), thereby implementing information write ("1") and erase ("0") operations. The transition process includes a transition from the crystalline state to the amorphous state and a transition from the amorphous state to the crystalline state, where the former is referred to as an amorphization process, and the latter is referred to as a crystallization process. Then, information is read based on a resistance difference between two physical phases. Such a nondestructive reading process can ensure accurate read of information already stored in a device cell. A resistivity difference of the phase change material layer 210 in the crystalline state and the amorphous state is several orders of magnitude, which achieves a noise margin high enough to distinguish between state "1" and state "0".

In an embodiment, the phase change memory cell further includes an interlayer dielectric layer 214, which is located between the bottom electrode 206 and the top electrode 212. The interlayer dielectric layer 214 is provided with a through trench; the metal layer 208 and the phase change material layer 210 are sequentially filled in the trench. For example, a material of the interlayer dielectric layer 214 includes an oxide or an oxynitride, such as silicon dioxide or silicon nitride. For example, a width of the trench along a direction X is greater than or equal to 10 nm and less than or equal to 20 nm.

Further referring to FIG. 5, in other embodiments, the phase change memory cell further includes a protective layer 216, covering a sidewall of the bottom electrode 206 and extending along the sidewall of the bottom electrode 206 to cover a sidewall of the top electrode 212. For example, a material of the protective layer 216 is silicon nitride.

Further referring to FIG. 1 and FIG. 4, in an embodiment, the semiconductor structure further includes: a plurality of word line structures 110 and a plurality of source line structures 112. The word line structures 110 are in contact with gate regions of the transistors 102 respectively, that is, connected to the gate regions of the transistors 102 respectively. The source line structures 112 are in contact with source regions of the transistors 102 respectively, that is, connected to the source regions of the transistors 102 respectively. The drain regions of the transistors 102 are in contact with the bottom portions of the transistor contact structures 104 respectively.

As shown in FIG. 1 and FIG. 3, in an embodiment, the semiconductor structure further includes: a plurality of bit line structures 114, where any one of the bit line structures 114 is in contact with the top portion of the memory contact structure 108 in a same column, and the bit line structure 114 is a straight line. For example, a length of the bit line structure 114 along a direction X is not less than a length of the top portion of the memory contact structure 108 along the direction X, where the direction X intersects with an extension direction of the bit line structure 114.

As shown in FIG. 4, in an embodiment, the semiconductor structure further includes: a plurality of bit line structures 114, where any one of the bit line structures 114 is in contact with the top portions of the memory contact structures 108 in two neighboring columns; the bit line structure 114 is a broken line, and is in contact with and connected to the memory contact structures 108 in two neighboring columns.

Figure 6:
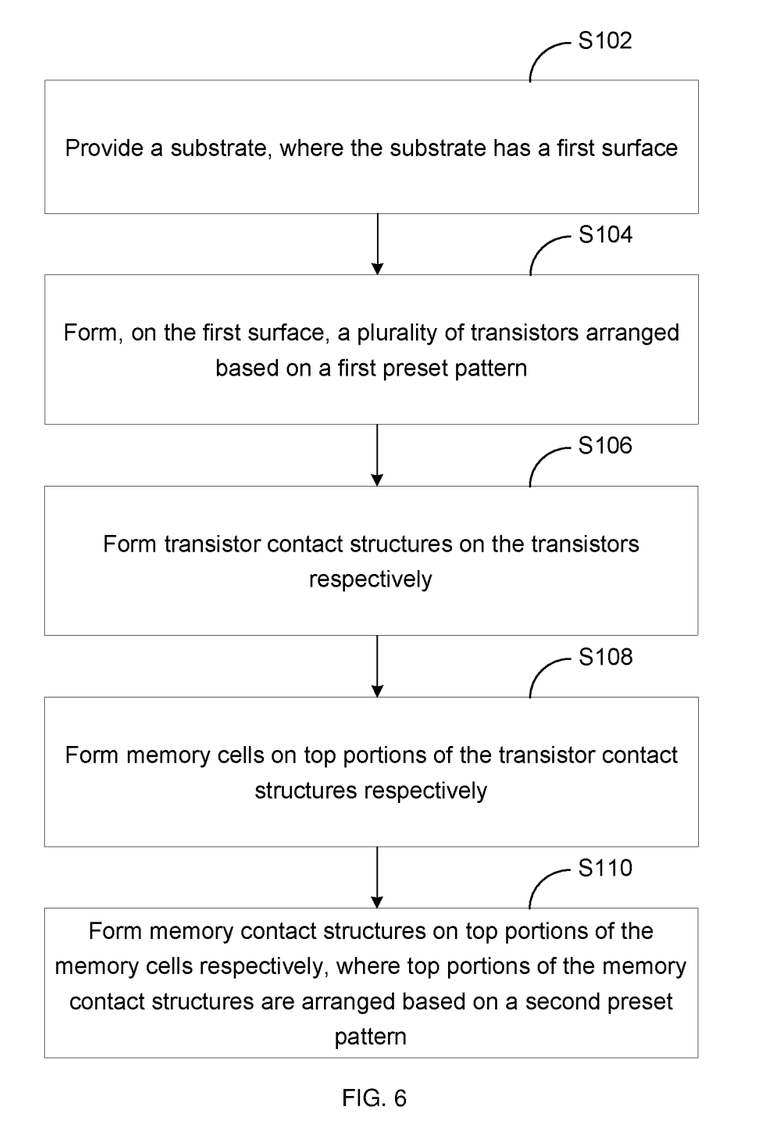
FIG. 6 is a schematic flowchart of a manufacturing method of a semiconductor structure according to an embodiment.

FIG. 6 is a schematic flowchart of a manufacturing method of a semiconductor structure according to an embodiment. As shown in FIG. 6, in the present embodiment, a manufacturing method of a semiconductor structure is provided, including the following steps.

S102: Provide a substrate, where the substrate has a first surface.

S104: Form, on the first surface, a plurality of transistors arranged based on a first preset pattern.

As shown in FIG. 1, a plurality of transistors 102 are formed on the first surface of the substrate 100, and the transistors 102 are arranged on the first surface of the substrate 100 based on the first preset pattern.

S106: Form transistor contact structures on the transistors respectively.

The transistor contact structures 104 are formed on the transistors 102 respectively. Bottom portions of the transistor contact structures 104 are in contact with the transistors 102 respectively, and are arranged based on the first preset pattern. Top portions of the transistor contact structures 104 are arranged based on the shape of a regular hexagon. The bottom portion of the transistor contact structure 104 is arranged opposite to the top portion of the transistor contact structure 104. That is, the bottom portion of the transistor contact structure 104 is parallel to the top portion of the transistor contact structure 104.

S108: Form memory cells on top portions of the transistor contact structures respectively.

The memory cells 106 are formed on the top portions of the transistor contact structures 104 respectively. The memory cells 106 correspond to the transistor contact structures 104 in a one-to-one manner. The memory cells 106 are arranged based on the shape of a regular hexagon, and are located at vertex positions and a central position of the regular hexagon.

S110: Form memory contact structures on top portions of the memory cells respectively, where top portions of the memory contact structures are arranged based on a second preset pattern.

The memory contact structures 108 are formed on the top portions of the memory cells 106 respectively. Bottom portions of the memory contact structures 108 are arranged based on the shape of a regular hexagon, and the top portions of the memory contact structures 108 are arranged based on the second preset pattern. The second preset pattern is different from the first preset pattern. The bottom portion of the memory contact structure 108 is arranged opposite to the top portion of the memory contact structure 108. That is, the bottom portion of the memory contact structure 108 is parallel to the top portion of the memory contact structure 108.

The manufacturing method of a semiconductor structure includes: providing a substrate 100 having a first surface; forming a plurality of transistors 102 on the first surface, where the transistors 102 are arranged based on a first preset pattern; forming transistor contact structures 104 on the transistors 102 respectively, where bottom portions of the transistor contact structures 104 are in contact with the transistors 102 respectively, the bottom portions of the transistor contact structures 104 are arranged based on the first preset pattern, and top portions of the transistor contact structures 104 are arranged based on the shape of a regular hexagon; forming memory cells 106 on the top portions of the transistor contact structures 104 respectively, where the memory cells 106 are arranged based on the shape of a regular hexagon and located at vertex positions and a central position of the regular hexagon; and forming memory contact structures 108 on top portions of the memory cells 106 respectively, where bottom portions of the memory contact structures 108 are arranged based on the shape of a regular hexagon, top portions of the memory contact structures 108 are arranged based on a second preset pattern, and the second preset pattern is different from the first preset pattern. The bottom portion of the transistor contact structure 104 is arranged opposite to the top portion of the transistor contact structure 104, and the bottom portion of the memory contact structure 108 is arranged opposite to the top portion of the memory contact structure 108. By disposing, between the transistors 102 and memory cells 106, the transistor contact structures 104 of which the bottom portions are arranged based on the first preset pattern and the top portions are arranged based on the shape of a regular hexagon, and disposing, on the top portions of the memory cells 106, the memory contact structures 108 of which the bottom portions are arranged based on the shape of a regular hexagon and the top portions are arranged based on the second preset pattern, the transistors 102, the memory cells 106, and device structures above the memory cells 106 are manufactured without changing positions or shapes of the transistors 102 and the device structures above the memory cells 106, thereby reducing the process difficulty and production cost.

As shown in FIG. 2, in an embodiment, the first preset pattern includes a regular hexagon, and the transistors 102 are located at vertex positions and a central position of the regular hexagon. In this case, the transistor contact structure 104 is a columnar structure above the transistor 102; orthographic projections of the top portion of the transistor contact structure 104 and the bottom portion of the transistor contact structure 104 on the first surface coincide with each other.

In an embodiment, an area of the top portion of the transistor contact structure 104 is equal to that of the bottom portion of the transistor contact structure 104.

As shown in FIG. 3, in an embodiment, the second preset pattern includes an array with a plurality of rows and columns.

In an embodiment, an area of the bottom portion of the memory contact structure 108 is larger than that of the top portion of the memory contact structure 108.

In an embodiment, an area of the bottom portion of the memory contact structure 108 is larger than that of the top portion of the memory cell 106. In other embodiments, the area of the bottom portion of the memory contact structure 108 is smaller than or equal to the area of the top portion of the memory cell 106. Such a configuration allows the memory contact structure 108 to be in close contact with the memory cell 106 while avoiding damage to the memory cell 106 in the process of forming the memory contact structure 108.

In an embodiment, a material of the memory contact structure 108 includes one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide (IrO$_2$); the metal silicide includes titanium silicide (TiSi).

As shown in FIG. 4, in an embodiment, the first preset pattern includes an array with a plurality of rows and columns.

In an embodiment, an area of the top portion of the transistor contact structure 104 is smaller than that of the bottom portion of the transistor contact structure 104.

Further referring to FIG. 4, in an embodiment, the second preset pattern includes a regular hexagon, and the memory contact structures 108 are located at vertex positions and a central position of the regular hexagon.

In an embodiment, an area of the top portion of the memory contact structure 108 is larger than that of the bottom portion of the memory contact structure 108.

Figure 7:
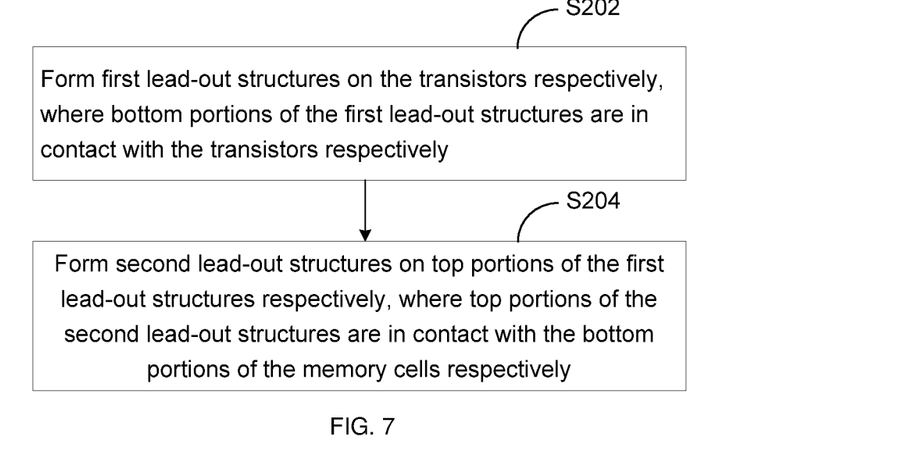
FIG. 7 is a schematic flowchart of step S106 according to an embodiment.

FIG. 7 is a schematic flowchart of step S106 according to an embodiment. As shown in FIG. 1, FIG. 4 and FIG. 7, in an embodiment, the transistor contact structures 104 each include: a first lead-out structure 202 and a second lead-out structure 204. Step S106 includes the following steps:

S202: Form the first lead-out structures on the transistors respectively, where bottom portions of the first lead-out structures are in contact with the transistors respectively.

Specifically, the bottom portion of the first lead-out structure 202 is in contact with the transistor 102 to lead out the transistor 102. For example, the bottom portion of the first lead-out structure 202 is connected to a drain region of the transistor 102 to lead out the drain region of the transistor 102. Typically, an area of the bottom portion of the first lead-out structure 202 is equal to that of the drain region of the transistor 102.

S204: Form the second lead-out structures on top portions of the first lead-out structures respectively, where top portions of the second lead-out structures are in contact with the bottom portions of the memory cells respectively.

Specifically, the bottom portion of the first lead-out structure 202 is the bottom portion of the transistor contact structure 104, and the top portion of the second lead-out structure 204 is the top portion of the transistor contact structure 104. The bottom portion of the first lead-out structure 202 is arranged opposite to the top portion of the first lead-out structure 202, and the bottom portion of the second lead-out structure 204 is arranged opposite to the top portion of the second lead-out structure 204. In this case, the bottom portions of the first lead-out structures 202 are arranged based on the first preset pattern, and the top portions of the second lead-out structures 204 are arranged based on the shape of a regular hexagon. When the first preset pattern is a regular hexagon, the bottom portions of the first lead-out structures 202 and the top portions of the second lead-out structures 204 are both arranged based on the shape of a regular hexagon.

Figure 8:
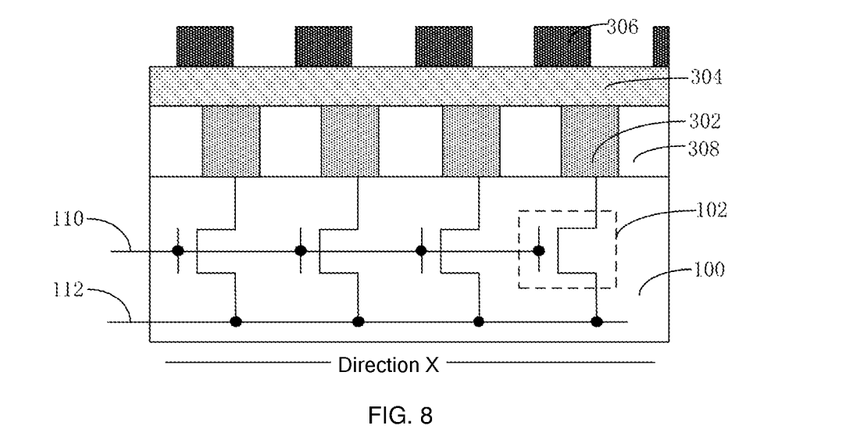
FIG. 8 is a schematic cross-sectional diagram of a semiconductor structure after a transistor contact mask layer is formed according to an embodiment.
Figure 9:
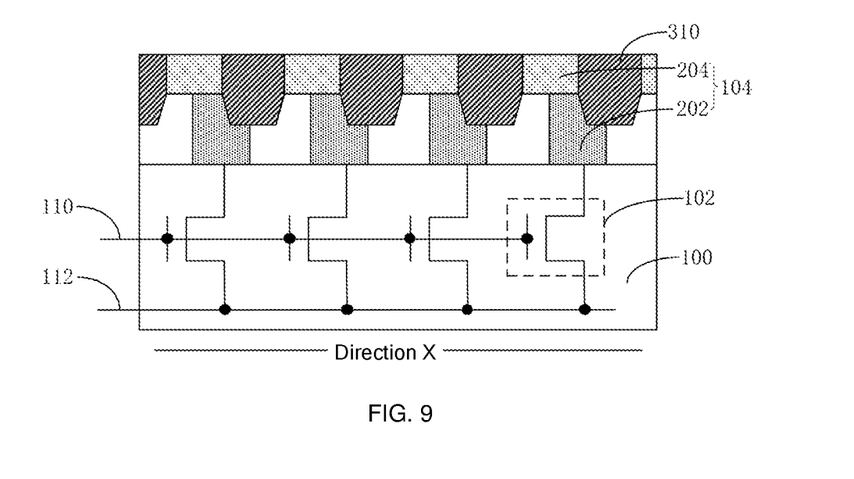
FIG. 9 is a schematic cross-sectional diagram of a semiconductor structure after transistor contact structures are formed according to an embodiment corresponding to FIG. 8.

FIG. 8 is a schematic cross-sectional diagram of a semiconductor structure after a transistor contact mask layer is formed according to an embodiment; FIG. 9 is a schematic cross-sectional diagram of a semiconductor structure after transistor contact structures are formed according to an embodiment corresponding to FIG. 8.

As shown in FIG. 8 and FIG. 9, the first preset pattern is an arrangement array with a plurality of rows and columns. In the first step, first contact structures 302, a first conductive film 304, and a transistor contact mask layer 306 are sequentially formed on the substrate 100 on which the transistors 102 have been formed. The first contact structure 302 is connected to the drain region of the transistor 102, and a first dielectric layer 308 is filled between adjacent first contact structures 302, where an upper surface of the first dielectric layer 308 is flush with an upper surface of the first contact structure 302. The first conductive film 304 is located on the upper surface of the first contact structure 302, and the transistor contact mask layer 306 is located on the first conductive film 304, to define the shape and position of the transistor contact structure 104. In the second step, a part of the first conductive film 304, a part of the first contact structure 302, and a part of the first dielectric layer 308 are first removed through an etching process by using the transistor contact mask layer 306 as a mask, to obtain the first lead-out structure 202 formed by the remaining first contact structure 302, and the second lead-out structure 204 formed by the remaining first conductive film 304. It may be understood that, in some embodiments, only the first conductive film 304 and the first contact structure 302 that are not covered by the transistor contact mask layer 306 are removed through an etching process, to form the second lead-out structure 204 and the first lead-out structure 202. Next, a second dielectric layer 310 is filled between adjacent second lead-out structures 204, where an upper surface of the second dielectric layer 310 is flush with an upper surface of the second lead-out structure 204.

In an embodiment, an area of the bottom portion of the second lead-out structure 204 is not smaller than that of the top portion of the first lead-out structure 202.

In an embodiment, a portion of the first lead-out structure 202 which is close to the bottom portion of the second lead-out structure 204 is a trapezoidal structure.

In an embodiment, materials of the first lead-out structure 202 and the second lead-out structure 204 include one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide (IrO$_2$); the metal silicide includes titanium silicide (TiSi). For example, the material of at least one of the memory contact structure 108, the first lead-out structure 202, and the second lead-out structure 204 is different from others. For example, the material of the first lead-out structure 202 is different from the material of the memory contact structure 108 and the second lead-out structure 204. In practical application, a same material may be selected as required to manufacture the memory contact structure 108, the first lead-out structure 202, and the second lead-out structure 204.

In an embodiment, the memory cell 106 includes a ferroelectric memory cell, a magnetoresistive memory cell, a resistance change memory cell, or a phase change memory cell.

As shown in FIG. 1 and FIG. 3, in an embodiment, the manufacturing method of a semiconductor structure further includes: forming a plurality of bit line structures 114 on the memory contact structures respectively, where any one of the bit line structures 114 is in contact with the top portion of the memory contact structure 108 in a same column, and the bit line structure 114 is a straight line. For example, a length of the bit line structure 114 along a direction X is not less than a length of the top portion of the memory contact structure 108 along the direction X, where the direction X intersects with an extension direction of the bit line structure 114.

As shown in FIG. 4, in an embodiment, the manufacturing method of a semiconductor structure further includes: forming a plurality of bit line structures 114 on the memory contact structures 108 respectively, where any one of the bit line structures 114 is in contact with the top portions of memory contact structures 108 in two neighboring columns; the bit line structure 114 is a broken line, and is in contact with and connected to the memory contact structures 108 in two neighboring columns.

Figure 10:
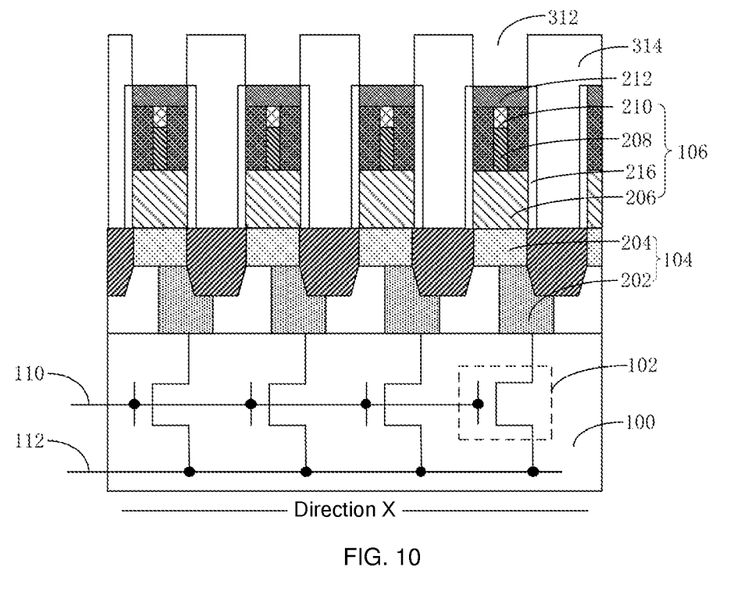
FIG. 10 is a schematic cross-sectional diagram of a semiconductor structure after memory cells are formed according to an embodiment corresponding to FIG. 9.
Figure 11:
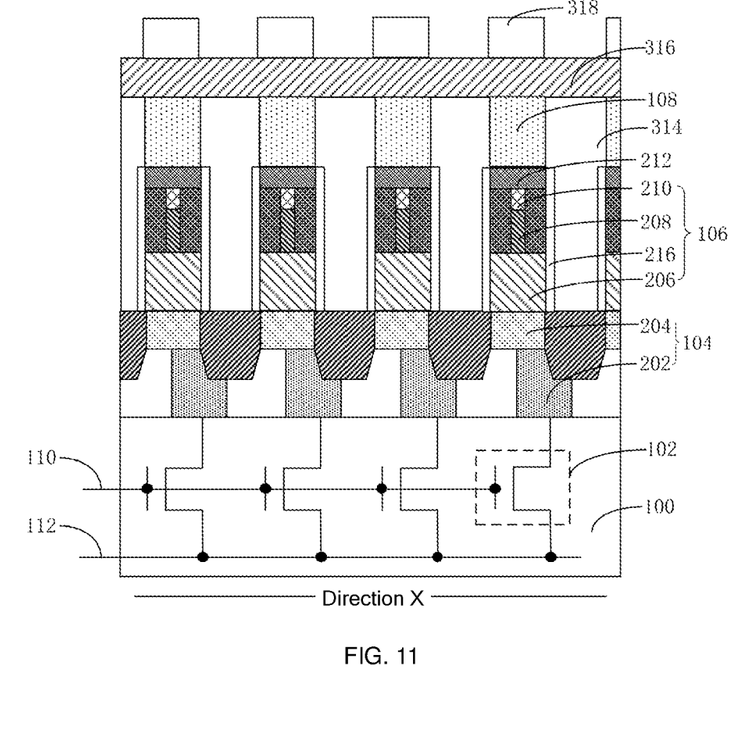
FIG. 11 is a schematic cross-sectional diagram of a semiconductor structure after a bit line mask layer is formed according to an embodiment corresponding to FIG. 10.
Figure 12:
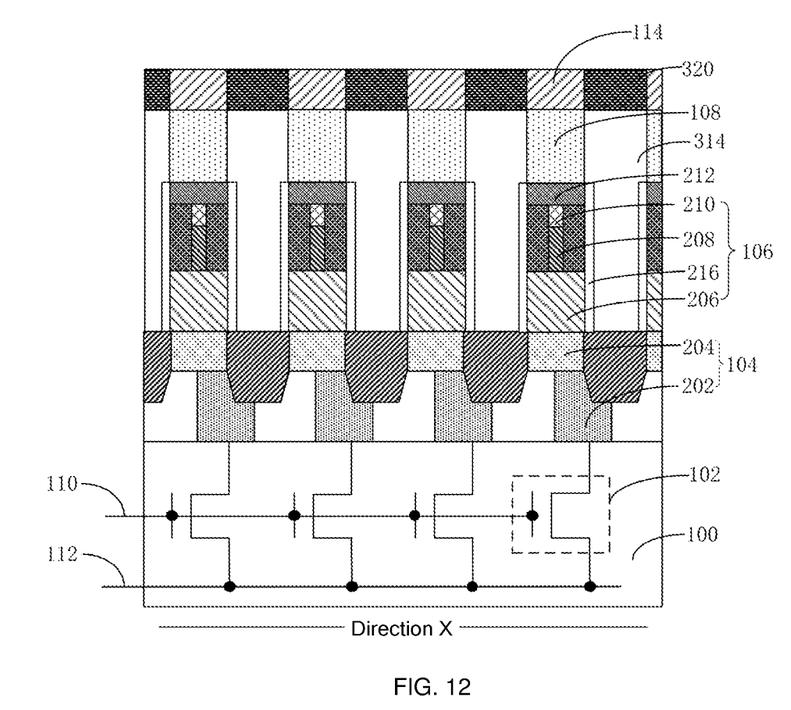
FIG. 12 is a schematic cross-sectional diagram of a semiconductor structure after bit line structures are formed according to an embodiment corresponding to FIG. 11.

FIG. 10 is a schematic cross-sectional diagram of a semiconductor structure after memory cells are formed according to an embodiment corresponding to FIG. 9; FIG. 11 is a schematic cross-sectional diagram of a semiconductor structure after a bit line mask layer 318 is formed according to an embodiment corresponding to FIG. 10; and FIG. 12 is a schematic cross-sectional diagram of a semiconductor structure after bit line structures 114 are formed according to an embodiment corresponding to FIG. 11. As shown in FIG. 10, FIG. 11 and FIG. 12, in the third step, the memory cells 106 are formed on the second lead-out structure 204 respectively. For example, if the memory cell 106 is a phase change memory cell, the memory cell 106 is formed through the following steps: First, a bottom electrode structure is formed on the upper surface of the second lead-out structure 204 through a deposition process, such as a physical vapor deposition process. Next, an interlayer dielectric structure with a flat surface is formed on an upper surface of the bottom electrode structure through a common deposition process and planarization process. Further, a trench running through the interlayer dielectric structure is provided in the interlayer dielectric structure through a photoetching process, to obtain an interlayer dielectric layer 214 formed by the remaining interlayer dielectric structure. For example, a material of the interlayer dielectric structure includes an oxide or an oxynitride, such as silicon dioxide or silicon nitride. A width of the trench along the direction X is greater than or equal to 10 nm and less than or equal to 20 nm. Next, a metal material structure whose upper surface is higher than the interlayer dielectric layer 214 is filled in the trench, and redundant metal material structure located on the surface of the interlayer dielectric layer 214 and in the trench is removed through etching, to obtain the metal layer 208 formed by the remaining metal material structure. For example, the upper surface of the metal layer 208 is lower than the upper surface of the interlayer dielectric layer 214. Then, the phase change material layer 210 is filled in the trench through a deposition process (such as atomic layer deposition (ALD) process) and an etching process. For example, the upper surface of the phase change material layer 210 is flush with the upper surface of the interlayer dielectric layer 214. A material of the phase change material layer 210 includes a sulfide material or a synthetic material containing germanium, antimony and tellurium (GST), such as $Ge_2Sb_2Te_5$. Further, the top electrode 212 is formed on the upper surface of the phase change material layer 210, and the width of the top electrode 212 along the direction X is greater than or equal to the width of the trench along the direction X. Then, the protection structure, such as a silicon nitride structure, is formed on the sidewalls of the bottom electrode 206 and the top electrode 212. The protection structure extends along the sidewall of the bottom electrode 206 to cover the upper surface of the top electrode 212. Next, third dielectric structures are formed on the substrate 100, where each third dielectric structure is filled between adjacent bottom electrodes 206, and an upper surface of the third dielectric structure is higher than an upper surface of the protection structure. Further, the protection structure and the third dielectric structure that are right above the top electrode 212 are removed through a photoetching or etching process, to obtain a memory contact trench 312 above the top electrode 212, a protective layer 216 formed by the remaining protection structure, and a third dielectric layer 314 formed by the remaining third dielectric structure. In the fourth step, a memory contact structure 108 is filled in the memory contact trench 312, where an upper surface of the memory contact structure 108 is flush with an upper surface of the third dielectric layer 314. In the fifth step, a bit line structure layer 316 is formed on the upper surface of the third dielectric layer 314. In the sixth step, a bit line mask layer 318 is formed on the bit line structure layer 316, where the bit line mask layer 318 defines a shape and position of the bit line structure 114. In the seventh step, a part of the bit line structure layer 316 is removed through an etching process by using the bit line mask layer 318 as a mask, to obtain the bit line structure 114 formed by the remaining bit line structure layer 316. In the eighth step, a fourth dielectric layer 320 is filled between adjacent bit line structures 114, where an upper surface of the fourth dielectric layer 320 is flush with the bit line structure 114. For example, materials of the first dielectric layer 308, the second dielectric layer 310, the third dielectric layer 314, and the fourth dielectric layer 320 include silicon dioxide, silicon oxynitride, and silicon nitride.

In an embodiment, materials of the bottom electrode 206, the metal layer 208, and the top electrode 212 include one or more selected from a group consisting of polysilicon, a metal, a conductive metal nitride, a conductive metal oxide, and a metal silicide. The metal may be tungsten (W), nickel (Ni), or titanium (Ti); the conductive metal nitride includes titanium nitride (TiN); the conductive metal oxide includes iridium oxide ($IrO_2$); the metal silicide includes titanium silicide (TiSi). For example, the material of at least one of the bottom electrode 206, the metal layer 208, and the top electrode 212 is different from others. For example, the material of the top electrode 212 is different from the material of the bottom electrode 206 and the metal layer 208. In practical application, a same material may be selected as required to manufacture the bottom electrode 206, the metal layer 208, and the top electrode 212.

The basic storage principle of the phase change memory cell (namely, phase change random access memory, PCRAM for short) is as follows: voltage or current pulse signals of different widths and heights are applied between the bottom electrode 206 and the top electrode 212 of the memory cell 106, to cause physical phase changes of the phase change material layer 210; that is, the phase change material layer 210 performs reversible phase transitions between a crystalline state (low resistance state) and an amorphous state (high resistance state), thereby implementing information write ("1") and erase ("0") operations. The transition process includes a transition from the crystalline state to the amorphous state and a transition from the amorphous state to the crystalline state, where the former is referred to as an amorphization process, and the latter is referred to as a crystallization process. Then, information is read based on a resistance difference between two physical phases. Such a nondestructive reading process can ensure accurate read of information already stored in a device cell. A resistivity difference of the phase change material layer 210 in the crystalline state and the amorphous state is several orders of magnitude, which achieves a noise margin high enough to distinguish between state "1" and state "0".

In the specification, the description of terms such as "some embodiments", "other embodiments", "desirable embodiments" and the like means that a specific feature, structure, material or characteristic described in combination with the embodiment(s) or example(s) are included in at least one embodiment or example of the present application. In this specification, the schematic description of the above terms does not necessarily refer to the same embodiment or example.

The technical characteristics of the foregoing embodiments can be employed in arbitrary combinations. To provide a concise description of these examples, all possible combinations of all technical characteristics of the embodiment may not be described; however, these combinations of technical characteristics should be construed as disclosed in the description as long as no contradiction occurs.

Only several embodiments of the present application are described in detail above, but they should not therefore be construed as limiting the scope of the present application. It should be noted that those of ordinary skill in the art can further make variations and improvements without departing from the conception of the present application. These variations and improvements all fall within the protection scope of the present application. Therefore, the protection scope of the present disclosure should be subject to the protection scope defined by the claims.

The invention claimed is:

1. A semiconductor structure, comprising:
a substrate, having a first surface;
a plurality of transistors, located on the first surface and arranged based on a first preset pattern;
a plurality of transistor contact structures, corresponding to the transistors in a one-to-one manner, wherein bottom portions of the transistor contact structures are in contact with the transistors respectively, the bottom portions of the transistor contact structures are arranged based on the first preset pattern, and top portions of the transistor contact structures are arranged based on the shape of a regular hexagon;
a plurality of memory cells, corresponding to the transistor contact structures in a one-to-one manner, wherein bottom portions of the memory cells are in contact with the top portions of the transistor contact structures respectively, and the memory cells are arranged based on the shape of a regular hexagon and located at vertex positions and a central position of the regular hexagon; and
a plurality of memory contact structures, corresponding to the memory cells in a one-to-one manner, wherein bottom portions of the memory contact structures are in contact with top portions of the memory cells respectively, the bottom portions of the memory contact structures are arranged based on the shape of a regular hexagon, top portions of the memory contact structures are arranged based on a second preset pattern, and the second preset pattern is different from the first preset pattern;
wherein the bottom portion of the transistor contact structure is arranged opposite to the top portion of the transistor contact structure, and the bottom portion of the memory contact structure is arranged opposite to the top portion of the memory contact structure.

2. The semiconductor structure according to claim 1, wherein the first preset pattern comprises a regular hexagon, and the transistors are located at vertex positions and a central position of the regular hexagon.

3. The semiconductor structure according to claim 2, wherein an area of the top portion of the transistor contact structure is equal to that of the bottom portion of the transistor contact structure.

4. The semiconductor structure according to claim 2, wherein the second preset pattern comprises an arrangement array with a plurality of rows and columns.

5. The semiconductor structure according to claim 4, wherein an area of the bottom portion of the memory contact structure is larger than that of the top portion of the memory contact structure.

6. The semiconductor structure according to claim 1, wherein the first preset pattern comprises an arrangement array with a plurality of rows and columns.

7. The semiconductor structure according to claim 6, wherein an area of the top portion of the transistor contact structure is smaller than that of the bottom portion of the transistor contact structure.

8. The semiconductor structure according to claim 6, wherein the second preset pattern comprises a regular hexagon, and the memory contact structures are located at vertex positions and a central position of the regular hexagon.

9. The semiconductor structure according to claim 8, wherein an area of the top portion of the memory contact structure is equal to that of the top portion of the memory contact structure.

10. The semiconductor structure according to claim 1, wherein the transistor contact structures each comprise:
a first lead-out structure, wherein a bottom portion of the first lead-out structure is the bottom portion of the transistor contact structure; and
a second lead-out structure, wherein a bottom portion of the second lead-out structure is in contact with a top portion of the first lead-out structure, and a top portion of the second lead-out structure is the top portion of the transistor contact structure;
wherein the bottom portion of the first lead-out structure is arranged opposite to the top portion of the first lead-out structure, and the bottom portion of the second lead-out structure is arranged opposite to the top portion of the second lead-out structure.

11. The semiconductor structure according to claim 10, wherein an area of the bottom portion of the second lead-out structure is larger than or equal to that of the top portion of the first lead-out structure.

12. The semiconductor structure according to claim 1, the semiconductor structure further comprises:
a word line structure, in contact with a gate region of the transistor; and
a source line structure, in contact with a source region of the transistor;
wherein a drain region of the transistor is in contact with the bottom portion of the transistor contact structure.

13. The semiconductor structure according to claim 1, wherein the memory cell comprises a ferroelectric memory cell, a magnetoresistive memory cell, a resistance change memory cell, or a phase change memory cell.

14. The semiconductor structure according to claim 4, the semiconductor structure further comprises:
a plurality of bit line structures, wherein any one of the bit line structures is in contact with the top portion of the memory contact structure in a same column.

15. The semiconductor structure according to claim 8, wherein the semiconductor structure further comprises:

a plurality of bit line structures, wherein any one of the bit line structures is in contact with the top portions of the memory contact structures in two neighboring columns.

16. A manufacturing method of a semiconductor structure, comprising:

provided a substrate, wherein the substrate has a first surface;

forming a plurality of transistors on the first surface, wherein the transistors are arranged based on a first preset pattern;

forming transistor contact structures on the transistors respectively, wherein bottom portions of the transistor contact structures are in contact with the transistors respectively, the bottom portions of the transistor contact structures are arranged based on the first preset pattern, and top portions of the transistor contact structures are arranged based on the shape of a regular hexagon;

forming memory cells on the top portions of the transistor contact structures respectively, wherein the memory cells are arranged based on the shape of a regular hexagon and located at vertex positions and a central position of the regular hexagon; and forming memory contact structures on top portions of the memory cells respectively, wherein bottom portions of the memory contact structures are arranged based on the shape of a regular hexagon, the top portions of the memory contact structures are arranged based on a second preset pattern, and the second preset pattern is different from the first preset pattern;

wherein the bottom portion of the transistor contact structure is arranged opposite to the top portion of the transistor contact structure, and the bottom portion of the memory contact structure is arranged opposite to the top portion of the memory contact structure.

17. The manufacturing method according to claim 16, wherein the first preset pattern comprises a regular hexagon, and the transistors are located at vertex positions and a central position of the regular hexagon; and an area of the top portion of the transistor contact structure is equal to that of the bottom portion of the transistor contact structure.

18. The manufacturing method according to claim 17, wherein the second preset pattern comprises an arrangement array with a plurality of rows and columns; and an area of the bottom portion of the memory contact structure is larger than that of the top portion of the memory contact structure.

19. The manufacturing method according to claim 16, wherein the first preset pattern comprises an arrangement array with a plurality of rows and columns; and an area of the top portion of the transistor contact structure is smaller than that of the bottom portion of the transistor contact structure.

20. The manufacturing method according to claim 19, wherein the second preset pattern comprises a regular hexagon, and the memory contact structures are located at vertex positions and a central position of the regular hexagon.

* * * * *